US012677370B2

(12) United States Patent
Sano et al.

(10) Patent No.: US 12,677,370 B2
(45) Date of Patent: Jul. 7, 2026

(54) STRETCHABLE DEVICE

(71) Applicant: Magnolia White Corporation, Tokyo (JP)

(72) Inventors: Takumi Sano, Tokyo (JP); Yosuke Hyodo, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 225 days.

(21) Appl. No.: 18/760,610

(22) Filed: Jul. 1, 2024

(65) Prior Publication Data

US 2025/0016920 A1     Jan. 9, 2025

(30) Foreign Application Priority Data

Jul. 4, 2023     (JP) ................................. 2023-110221

(51) Int. Cl.
*H05K 1/02*          (2006.01)
*G01L 1/20*          (2006.01)
*H05K 1/03*          (2006.01)

(52) U.S. Cl.
CPC ......... *H05K 1/0393* (2013.01); *H05K 1/0278* (2013.01); *H05K 1/0283* (2013.01)

(58) Field of Classification Search
CPC .. H05K 1/0393; H05K 1/0278; H05K 1/0283; G01L 1/205
See application file for complete search history.

(56) References Cited

U.S. PATENT DOCUMENTS

| 2018/0046221 A1* | 2/2018 | Choi | H05B 33/22 |
| 2018/0114825 A1* | 4/2018 | Hong | H10K 59/121 |
| 2020/0028102 A1* | 1/2020 | Kim | H10K 59/131 |
| 2021/0234108 A1* | 7/2021 | Sano | H10K 77/111 |
| 2023/0384832 A1* | 11/2023 | Koo | H05K 1/0283 |
| 2024/0023238 A1* | 1/2024 | Wang | G09F 9/301 |

FOREIGN PATENT DOCUMENTS

JP          2021118273 A     8/2021

* cited by examiner

*Primary Examiner* — Amol H Patel
(74) *Attorney, Agent, or Firm* — Maier & Maier, PLLC

(57)          ABSTRACT

According to an aspect, a stretchable device includes: a resin base member; an array layer provided to the resin base member; and a pair of resin layers that sandwich the resin base member and the array layer from both sides in a thickness direction in which the resin base member and the array layer are disposed, the resin layers being made of resin having lower elastic modulus than that of the resin base member. The resin base member includes: bodies separated from each other in a direction orthogonal to the thickness direction; and hinges coupling the bodies while meandering. The array layer includes functional elements overlapping the bodies when viewed in the thickness direction. The resin layers are provided with first rigid parts having higher elastic modulus than that of the resin that forms the resin layers. The first rigid parts overlap the bodies when viewed in the thickness direction.

9 Claims, 21 Drawing Sheets

STRETCHABLE DEVICE

CROSS-REFERENCE TO RELATED APPLICATION

This application claims the benefit of priority from Japanese Patent Application No. 2023-110221 filed on Jul. 4, 2023, the entire contents of which are incorporated herein by reference.

BACKGROUND

1. Technical Field

What is disclosed herein relates to a stretchable device.

2. Description of the Related Art

Stretchable devices have excellent elasticity and flexibility. Stretchable devices include an array layer, a resin base member serving as a base member for the array layer, and two resin layers that sandwich the array layer and the resin base member. The resin base member includes bodies arrayed in a matrix (row-column configuration) and hinges that couple the bodies to each other. As described in Japanese Patent Application Laid-open Publication No. 2021-118273, for example, the hinges have a meandering shape. The array layer of the stretchable device includes an electrical circuit. The electrical circuit is, for example, a load detection circuit. The load detection circuit includes strain gauges and switch elements. The strain gauge is disposed overlapping the hinge in plan view. The switch element is disposed overlapping the body in plan view.

When a tensile load acts on the stretchable device, the arcs of the hinge deform to expand. As a result, the distance from one end of the hinge to the other increases, and the stretchable device is stretched. The strain gauge deforms corresponding to deformation of the hinge, and the resistance of the strain gauge changes. By detecting the amount of change in resistance, the magnitude of the load acting on the hinge is calculated. By contrast, deformation of the body is undesirable because it may possibly damage the switch element disposed at the body. Therefore, it is desired to develop a stretchable device in which functional elements (switch elements) disposed at the bodies are less likely to be damaged.

For the foregoing reasons, there is a need for a stretchable device in which functional elements disposed at bodies are less likely to be damaged by a load in use.

SUMMARY

According to an aspect, a stretchable device includes: a resin base member; an array layer provided to the resin base member; and a pair of resin layers that sandwich the resin base member and the array layer from both sides in a thickness direction in which the resin base member and the array layer are disposed, the resin layers being made of resin having lower elastic modulus than that of the resin base member. The resin base member includes: a plurality of bodies separated from each other in a direction orthogonal to the thickness direction; and a plurality of hinges that couple the bodies while meandering. The array layer includes functional elements overlapping the bodies when viewed in the thickness direction. The resin layers are provided with first rigid parts having higher elastic modulus than that of the resin that forms the resin layers. The first rigid parts overlap the bodies when viewed in the thickness direction.

BRIEF DESCRIPTION OF THE DRAWINGS

FIG. 2 is a schematic of a section of the stretchable device according to the embodiment, and more specifically a sectional view along line II-II of FIG. 3;

FIG. 13 is a flowchart of the former part of the process of manufacturing the stretchable device according to the second embodiment;

DETAILED DESCRIPTION

Figure 1:
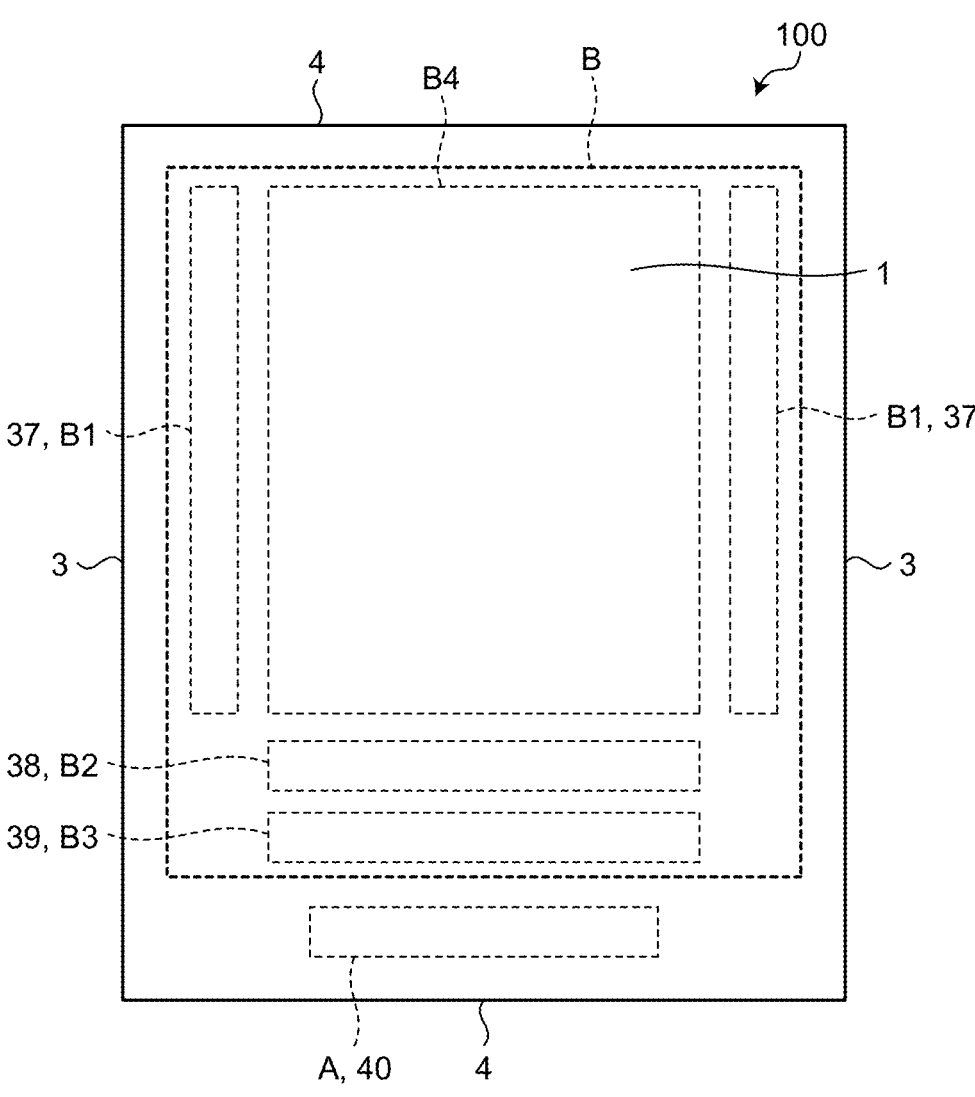
FIG. 1 is a schematic of a stretchable device according to an embodiment.
Figure 1:
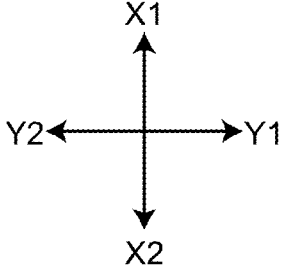

Exemplary aspects (embodiments) to embody the present disclosure are described below in greater detail with reference to the accompanying drawings. The contents described in the embodiments below are not intended to limit the disclosure according to the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by the same reference numerals, and detailed explanation thereof may be appropriately omitted.

When the term "on" is used to describe an aspect where a first structure is disposed on or above a second structure in the present specification and the claims, it includes both of the following cases unless otherwise noted: a case where the first structure is disposed on and in contact with the second structure, and a case where the first structure is disposed above the second structure with still another structure interposed therebetween.

First Embodiment

Figure 2:
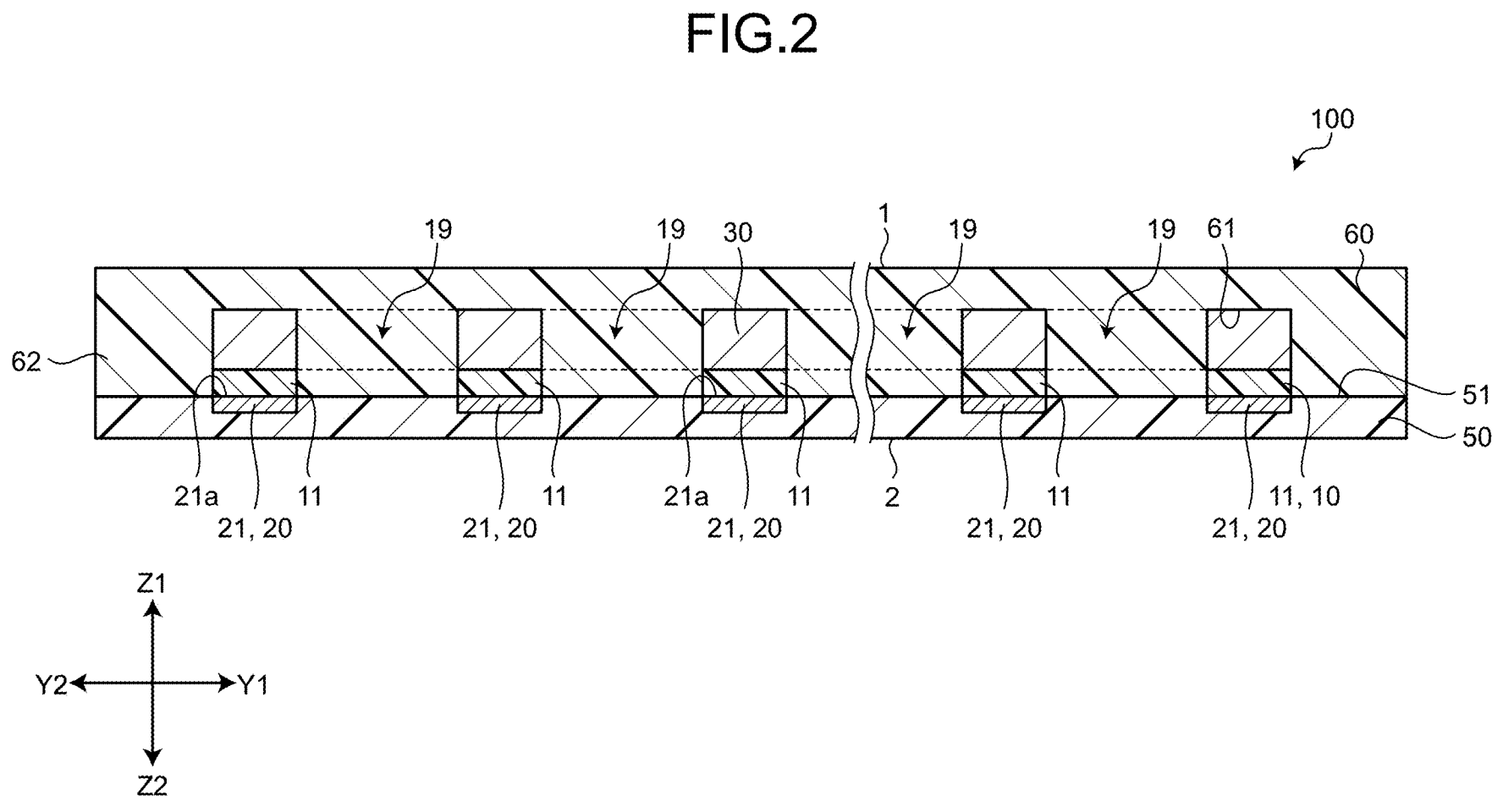

FIG. 1 is a schematic of a stretchable device according to an embodiment. FIG. 2 is a schematic of a section of the stretchable device according to the embodiment, and more specifically a sectional view along line II-II of FIG. 3. As illustrated in FIGS. 1 and 2, a stretchable device 100 is formed in a plate shape. The stretchable device 100 has a surface 1 and a back surface 2 (not illustrated in FIG. 1, and refer to FIG. 2) facing opposite to each other. In the following description, the direction parallel to the surface 1 and the back surface 2 is referred to as a planar direction.

As illustrated in FIG. 1, the stretchable device 100 is formed in a rectangular shape when viewed in the direction facing the surface 1. Therefore, the surface 1 has a pair of long sides 3 and a pair of short sides 4. In the following description, the direction parallel to the long side 3 is referred to as a longitudinal direction, and the direction parallel to the short side 4 is referred to as an intersecting direction.

As illustrated in FIG. 2, the stretchable device 100 includes a first resin layer 50, a resin base member 10, an array layer 30, and a second resin layer 60 stacked in the order as listed. The first resin layer 50 and the second resin layer 60 may be referred to as a pair of resin layers.

The direction in which the first resin layer 50, the resin base member 10, the array layer 30, and the second resin layer 60 are stacked is hereinafter referred to as a thickness direction. In the thickness direction, the direction in which the second resin layer 60 is disposed when viewed from the first resin layer 50 is referred to as a first thickness direction Z1, and the direction opposite to the first thickness direction Z1 is referred to as a second thickness direction Z2. The view of the stretchable device 100 from the first thickness direction Z1 or the second thickness direction Z2 is referred to as plan view.

The first resin layer 50 and the second resin layer 60 are made of resin and have insulating, elastic, and flexible properties. The resin used as the first resin layer 50 and the second resin layer 60 is acrylic resin, for example. The elastic modulus of acrylic resin is 0.1 to 10 MPa. The first resin layer 50 and the second resin layer 60 according to the present disclosure are not limited to acrylic resin. They may be epoxy resin, urethane resin, or other resin and are not particularly limited.

The first resin layer 50 and the second resin layer 60 are formed in a plate shape and extend in the planar direction. The surface of the first resin layer 50 in the second thickness direction Z2 serves as the back surface 2 of the stretchable device 100. The first resin layer 50 has a first surface 51 facing the first thickness direction Z1. The resin base member 10 is stacked on the first surface 51. The first resin layer 50 is provided with first rigid parts 20. The first rigid part 20 will be described later in greater detail.

The surface of the second resin layer 60 in the first thickness direction Z1 serves as the surface 1 of the stretchable device 100. A surface 61 of the second resin layer 60 in the second thickness direction Z2 covers the array layer 30 from the first thickness direction Z1. The ends of the second resin layer 60 in the longitudinal direction and the intersecting direction are provided with a frame part 62 that protrudes from the surface 61 in the second thickness direction Z2.

The frame part 62 has an annular shape in plan view and surrounds the outer periphery of the resin base member 10 and the array layer 30. The surface of the frame part 62 in the second thickness direction adheres to the first surface 51 of the first resin layer 50. Thus, the first resin layer 50 and the second resin layer 60 cooperate to serve as a housing that accommodates the resin base member 10 and the array layer 30.

Figure 3:
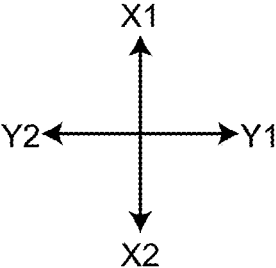
FIG. 3 is a plan view of a resin base member disposed on a first surface of a first resin layer according to a first embodiment viewed from a first thickness direction.

FIG. 3 is a plan view of the resin base member disposed on the first surface of the first resin layer according to a first embodiment viewed from the first thickness direction. In FIG. 3, the resin base member 10 is hatched to make it easy to see the resin base member 10. The resin base member 10 adheres to the first surface 51 of the first resin layer 50. The resin base member 10 has elastic, flexible, and insulating properties. The resin base member 10 is made of resin material, such as polyimide.

The resin base member 10 includes a plurality of bodies 11, a plurality of hinges 12 that extends while meandering, coupling bodies (not illustrated), and coupling hinges 18. The coupling bodies (not illustrated) are disposed at one end of the first surface 51 in the longitudinal direction (refer to dashed line A illustrated in FIG. 1). The coupling bodies (not illustrated) are provided with a coupler 40 of the array layer 30 in the first thickness direction Z1. The bodies 11 and the hinges 12 are disposed in the area of the first surface 51 other than one end in the longitudinal direction (refer to dashed line B illustrated in FIG. 1). The coupling hinges 18 are disposed between dashed line A and dashed line B illustrated in FIG. 1.

In the longitudinal direction, the direction in which the bodies 11 and the hinges 12 are disposed when viewed from the coupling hinges 18 is hereinafter referred to as a first longitudinal direction X1, and the direction opposite to the first longitudinal direction X1 is referred to as a second longitudinal direction X2. In the intersecting direction, when the stretchable device 100 is viewed from the first thickness direction Z1, the direction in which the right side is positioned is referred to as a first intersecting direction Y1, and the direction in which the left side is positioned is referred to as a second intersecting direction Y2.

Figure 4:
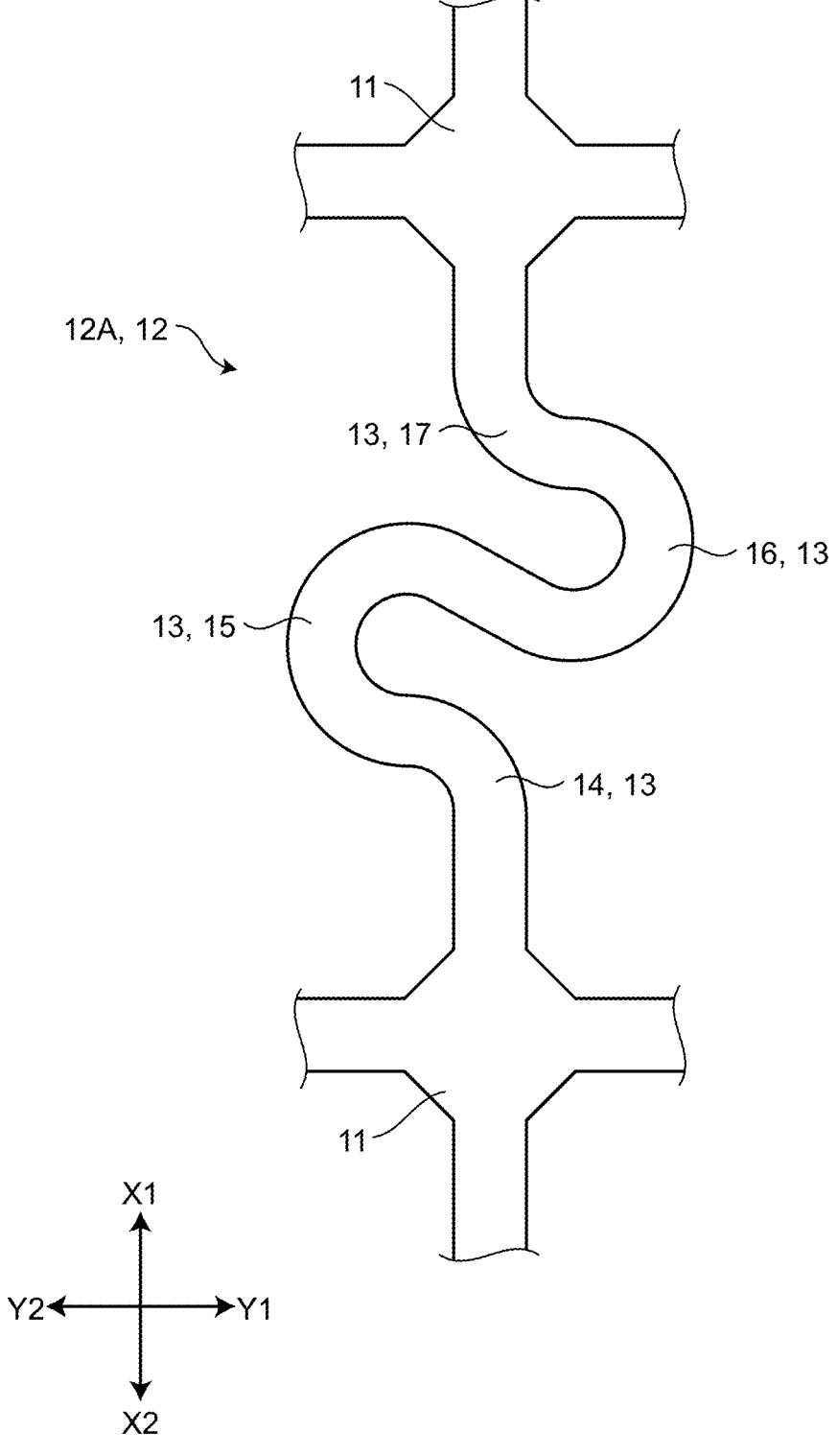
FIG. 4 is an enlarged view of bodies and a hinge according to the first embodiment.

FIG. 4 is an enlarged view of the bodies and the hinge according to the first embodiment. The body 11 has a quadrilateral (square) shape in plan view. The body 11 is disposed with its four corners facing the longitudinal direction and the intersecting direction. As illustrated in FIG. 3, the bodies 11 are arrayed in the longitudinal direction and the intersecting direction and are separated from one another. The shape of the body 11 according to the present disclosure in plan view is not limited to a quadrilateral shape and may be circular or other polygonal shapes.

As illustrated in FIG. 3, the hinges 12 include longitudinal hinges 12A extending in the longitudinal direction and lateral hinges 12B extending in the intersecting direction. When the longitudinal hinge 12A is rotated by 90 degrees in plan view, it has the same shape as that of the lateral hinge 12B. Therefore, in the following description of the hinge 12, the longitudinal hinge 12A is described as a representative example, and description of the lateral hinge 12B is omitted.

As illustrated in FIG. 4, the longitudinal hinge 12A has four bends 13 and extends in the longitudinal direction while meandering. Each bend 13 according to the present embodiment has an arc shape. The bend according to the present disclosure does not necessarily have an arc shape and may have an angular shape. The number of bends is not limited to four.

The four bends 13 are a first arc 14, a second arc 15, a third arc 16, and a fourth arc 17 arranged in the order as listed, from the second longitudinal direction X2. The first arc 14 and the fourth arc 17 each form a quadrant and are bent at 90 degrees. The second arc 15 and the third arc 16 each form a semi-circular arc and are bent at 180 degrees.

Figure 5:
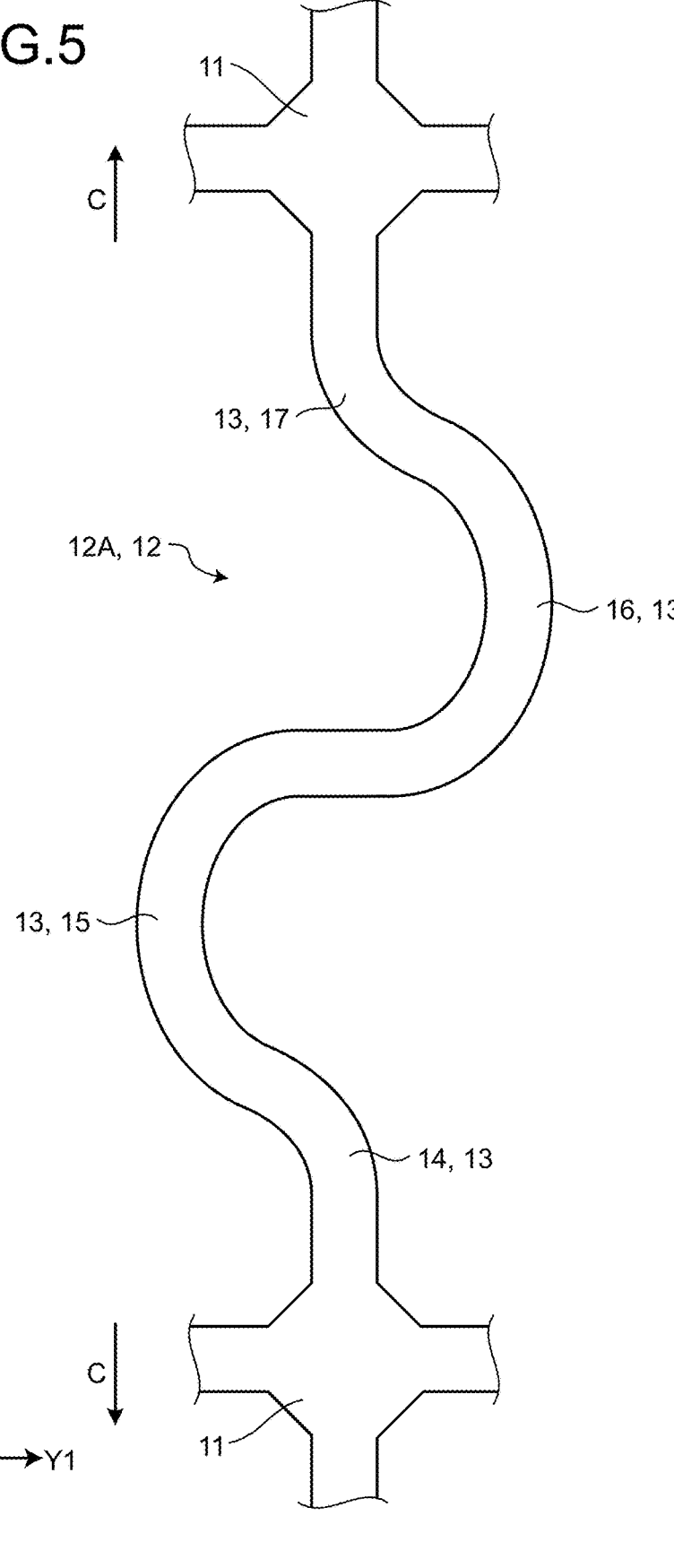
FIG. 5 is an enlarged view of the bodies and the hinge according to the first embodiment on which a tensile load acts.

FIG. 5 is an enlarged view of the bodies and the hinge according to the first embodiment on which a tensile load acts. As illustrated in FIG. 5, when a tensile load in the longitudinal direction (refer to arrow C in FIG. 5) acts on the longitudinal hinge 12A, the first arc 14, the second arc 15, the third arc 16, and the fourth arc 17 are each deformed such that the curvature decreases. As a result, the distance from one end of the longitudinal hinge 12A to the other increases, and the bodies 11 move away from each other. When a compressive load in the longitudinal direction acts on the longitudinal hinge 12A, the first arc 14, the second arc 15, the third arc 16, and the fourth arc 17 are each deformed such that the curvature increases, which is not specifically illustrated. As a result, the distance from one end of the longitudinal hinge 12A to the other decreases, and the bodies 11 move closer to each other.

As illustrated in FIG. 3, the part surrounded by the four hinges 12 disposed in an annular (square) shape is a hollow portion 19 passing through the resin base member 10 in the thickness direction. In other words, the resin base member 10 has a plurality of hollow portions 19.

As illustrated in FIG. 2, the hollow portion 19 is filled with the second resin layer 60. In other words, the second resin layer 60 with low rigidity (high elastic modulus) is disposed adjacently to the hinges 12 in the longitudinal direction or the intersecting direction. Therefore, when a load acts on the stretchable device 100, the hinges 12 deform.

While the hollow portion 19 according to the present embodiment is filled with the second resin layer 60, the hollow portion 19 according to the present disclosure may be filled with the first resin layer 50. Alternatively, the hollow portion 19 may be filled with each of the first resin layer 50 and the second resin layer 60. Still alternatively, the hollow portion 19 may be filled with resin other than the first resin layer 50 or the second resin layer 60. Still alternatively, the hollow portion 19 may be a space provided with nothing.

As illustrated in FIG. 3, the coupling hinge 18 extends in the longitudinal direction. The end of the coupling hinge 18 in the first longitudinal direction X1 is coupled to the body 11. The end of the coupling hinge 18 in the second longitudinal direction X2 is coupled to the coupling body, which is not illustrated. Similarly to the hinge 12, the coupling hinge 18 has a plurality of bends 18a and extends in the longitudinal direction while meandering. The space between the coupling hinges 18 is the hollow portion 19 and is filled with the second resin layer 60. Therefore, when a load acts on the stretchable device 100, the coupling hinges 18 also deform.

As illustrated in FIG. 2, the array layer 30 is provided on the surface of the resin base member 10 in the first thickness direction Z1. The array layer 30 includes a plurality of insulating layers (not illustrated) stacked in the thickness direction and a load detection circuit 31 (refer to FIG. 6) the insulation from the outside of which is secured by the insulating layers.

Figure 6:
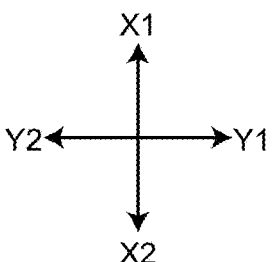
FIG. 6 is a circuit diagram of an electrical circuit included in an array layer according to the first embodiment.

FIG. 6 is a circuit diagram of an electrical circuit included in the array layer according to the first embodiment. As illustrated in FIG. 6, the load detection circuit 31 includes strain gauges 32, gate lines 33, signal lines 34, power supply lines 35, transistors 36, gate line drive circuits 37 (refer to FIG. 1), a signal line selection circuit 38 (refer to FIG. 1), a power supply line selection circuit 39 (refer to FIG. 1), and a coupler 40 (refer to FIG. 1).

As illustrated in FIG. 3, the strain gauge 32 is disposed at and extends along the longitudinal hinge 12A. Therefore, when the longitudinal hinge 12A deforms, the strain gauge 32 also deforms, and the resistance of the strain gauge 32 changes. While the strain gauge 32 according to the present embodiment is disposed at the longitudinal hinge 12A, the strain gauge 32 according to the present disclosure may also be disposed at the lateral hinge 12B.

Not all the longitudinal hinges 12A are provided with the strain gauge 32. Specifically, among all the longitudinal hinges 12A, the longitudinal hinges 12A disposed on both sides in the intersecting direction (refer to the areas enclosed by dashed lines B1 in FIG. 1) are provided with no strain gauge 32. Among all the longitudinal hinges 12A, the longitudinal hinges 12A disposed at the end in the second longitudinal direction X2 (refer to the areas enclosed by dashed lines B2 and B3 in FIG. 1) are provided with no strain gauge 32. In other words, among the longitudinal hinges 12A, only the longitudinal hinges 12A disposed in the area enclosed by dashed line B4 in FIG. 1 are provided with the strain gauges 32. The area provided with the strain gauges 32 is hereinafter referred to as a detection region B4.

As illustrated in FIG. 3, the gate line 33 is disposed over a plurality of lateral hinges 12B and a plurality of bodies 11, thereby extending in the intersecting direction in the detection region B4. The signal line 34 and the power supply line 35 are disposed over a plurality of longitudinal hinges 12A and a plurality of bodies 11, thereby extending in the longitudinal direction in the detection region B4.

The transistor 36 is disposed at each body 11 provided in the detection region B4. As illustrated in FIG. 6, the gate electrode of the transistor 36 is coupled to the gate line 33. The drain electrode of the transistor 36 is coupled to the power supply line 35. The source electrode of the transistor 36 is coupled to the signal line 34 via the strain gauge 32.

The gate line drive circuit 37 is a circuit that drives a plurality of gate lines 33 based on control signals supplied from a drive integrated circuit (IC). The gate line drive circuits 37 are disposed at a plurality of bodies 11 and a plurality of hinges 12 provided on opposite sides in the intersecting direction (refer to the areas enclosed by dashed lines B1 in FIG. 1) out of all bodies 11 and all hinges 12.

The signal line selection circuit 38 is a switch circuit that sequentially or simultaneously selects a plurality of signal lines 34 based on control signals supplied from the drive IC. As illustrated in FIG. 1, the signal line selection circuit 38 is disposed at a plurality of bodies 11 and a plurality of hinges 12 provided at the end in the second longitudinal direction X2 (refer to the area enclosed by dashed line B2 in FIG. 1) out of all bodies 11 and all hinges 12.

The power supply line selection circuit 39 is a switch circuit that sequentially or simultaneously selects a plurality of power supply lines based on control signals supplied from the drive IC. As illustrated in FIG. 1, the power supply line selection circuit 39 is disposed at a plurality of bodies 11 and a plurality of hinges 12 provided at the end in the second longitudinal direction X2 (refer to the area enclosed by dashed line B3 in FIG. 1) out of all bodies 11 and all hinges 12.

The coupler 40 is coupled to a drive integrated circuit (IC) disposed outside the stretchable device 100. The drive IC according to the present disclosure may be mounted as a chip on film (COF) on a flexible printed circuit board or a rigid board coupled to the coupler 40.

An example of the operation of the load detection circuit 31 is described below. As illustrated in FIG. 6, when one gate line 33 selected by the gate line drive circuit 37 is driven, a plurality of transistors 36 arrayed in the intersecting direction and coupled to the gate line 33 are turned ON. The power supply line selection circuit 39 selects one or a plurality of power supply lines 35. As a result, a signal (e.g., voltage value) is supplied from the selected power supply line 35 to the strain gauge 32 via the transistor 36.

If the longitudinal hinge 12A is not deformed, the voltage value of the signal flowing through the strain gauge 32 is a predetermined value. By contrast, if the longitudinal hinge 12A is deformed, the resistance of the strain gauge 32 changes. In other words, the signal flowing through the strain gauge 32 indicates a voltage value different from the predetermined value. A signal (detection result) output from the strain gauge 32 is supplied to the signal line 34. When the signal line 34 is selected by the signal line selection circuit 38, it supplies the signal (detection result) to an external arithmetic unit (not illustrated) via the coupler 40. The arithmetic unit calculates the load acting on the hinge 12 from the received signal (detection result). The following describes the first rigid part 20 in greater detail.

As illustrated in FIG. 2, the first rigid part 20 is made of material with higher elastic modulus than that of the resin forming the pair of resin layers (the first resin layer 50 and the second resin layer 60). The first rigid part 20 according to the present embodiment is a glass piece 21 made of glass. Therefore, the first rigid part 20 has higher rigidity than those of the first resin layer 50 and the second resin layer 60.

The glass piece 21 is formed in a plate shape and extend in the planar direction. The glass piece 21 is embedded in the first resin layer 50. A surface 21a of the glass piece 21 in the first thickness direction Z1 is parallel to the first surface 51 of the first resin layer 50. The surface 21a of the glass piece 21 in the first thickness direction Z1 is in contact with the body 11 of the resin base member 10. In other words, the glass piece 21 is stacked on the body 11 in the thickness direction and overlaps therewith. This configuration makes the body 11 less likely to deform, thereby suppressing damage to the transistor 36 (functional element) disposed on the body 11 in the first thickness direction Z1.

Figure 7:
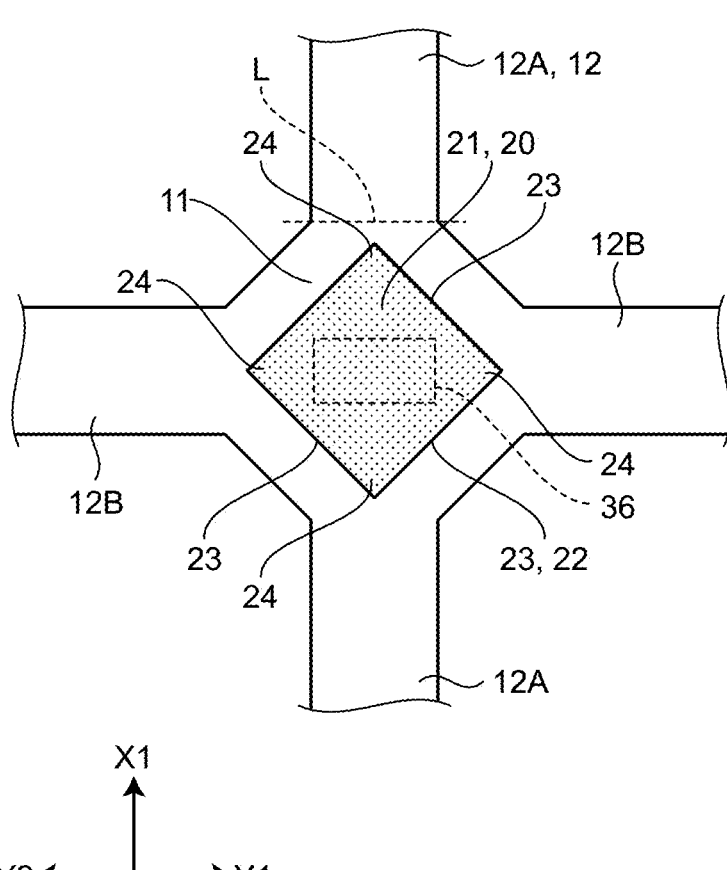
FIG. 7 is an enlarged view of a glass piece according to the first embodiment viewed from a second thickness direction.

FIG. 7 is an enlarged view of the glass piece according to the first embodiment viewed from the second thickness direction. As illustrated in FIG. 7, the glass piece 21 is formed in a square shape in plan view. Therefore, an outer peripheral surface 22 of the glass piece 21 has four side surfaces 23 and four corners 24 at which the side surfaces 23 intersect each other. The glass piece 21 is disposed with the four corners 24 facing the longitudinal direction and the intersecting direction. The glass piece 21 is larger than the transistor 36 (functional element) in plan view. In other words, the glass piece 21 overlaps the entire transistor 36 (functional element). This configuration reliably suppresses damage to the transistor 36 (functional element).

The glass piece 21 is smaller than the body 11 in plan view. In other words, the outer peripheral surface 22 of the glass piece 21 does not extend outside the body 11. If part of the glass piece 21 is disposed on the hinge 12 beyond a boundary L between the body 11 and the hinge 12, the glass piece 21 prevents deformation of the hinge 12. By contrast, the glass piece 21 according to the present embodiment does not exceed the boundary L and is not disposed on the hinge 12. The glass piece 21 is also not disposed in the hollow portion 19. Therefore, the glass piece 21 does not prevent deformation of the hinge 12 or deformation of the second resin layer 60 in the hollow portion 19. In other words, the glass piece 21 does not impair the elasticity and flexibility of the stretchable device 100. The following describes a method for manufacturing the stretchable device 100 according to the first embodiment.

Figure 8:
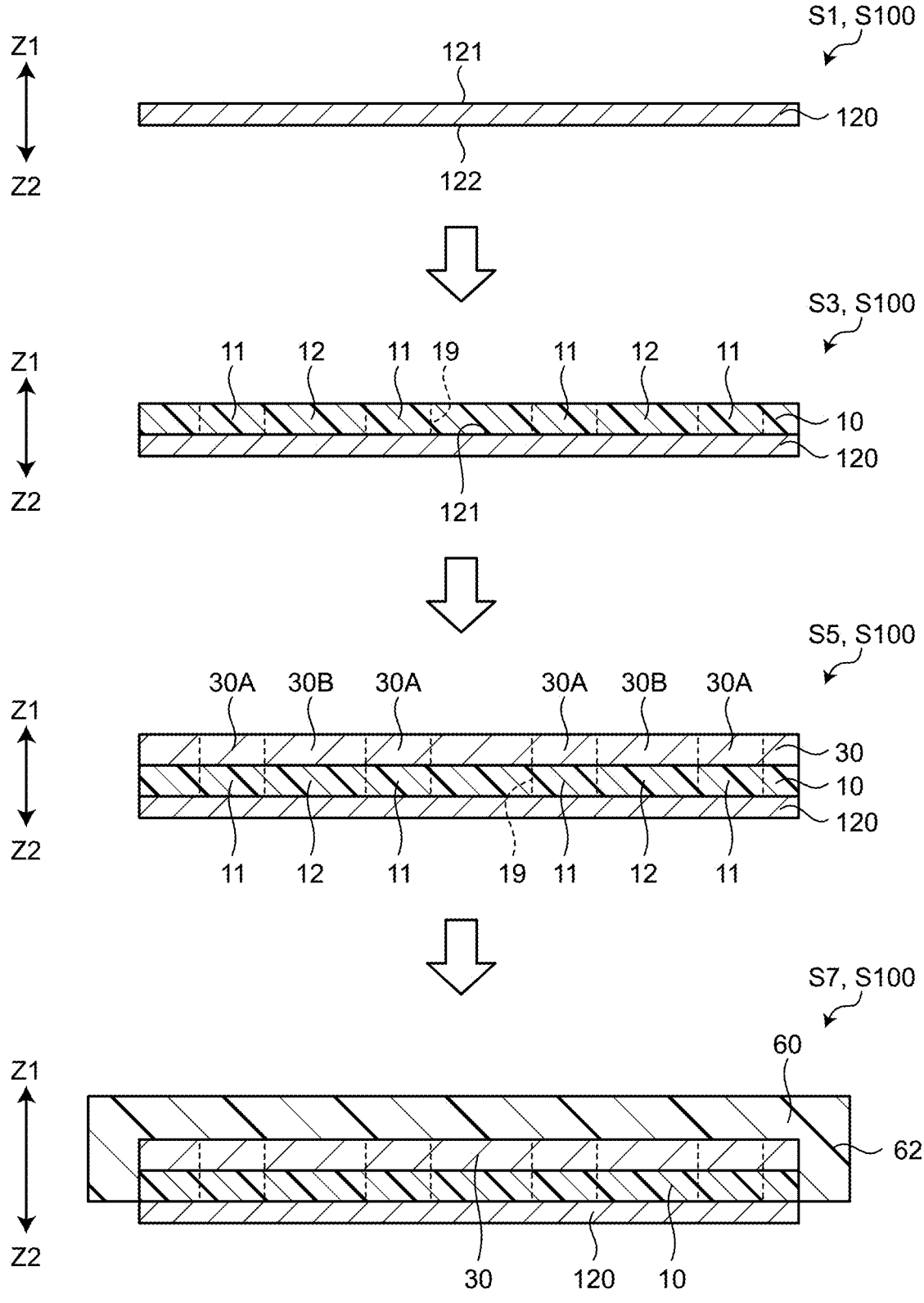
FIG. 8 is a flowchart of the first half of the process of manufacturing the stretchable device according to the first embodiment.
Figure 9:
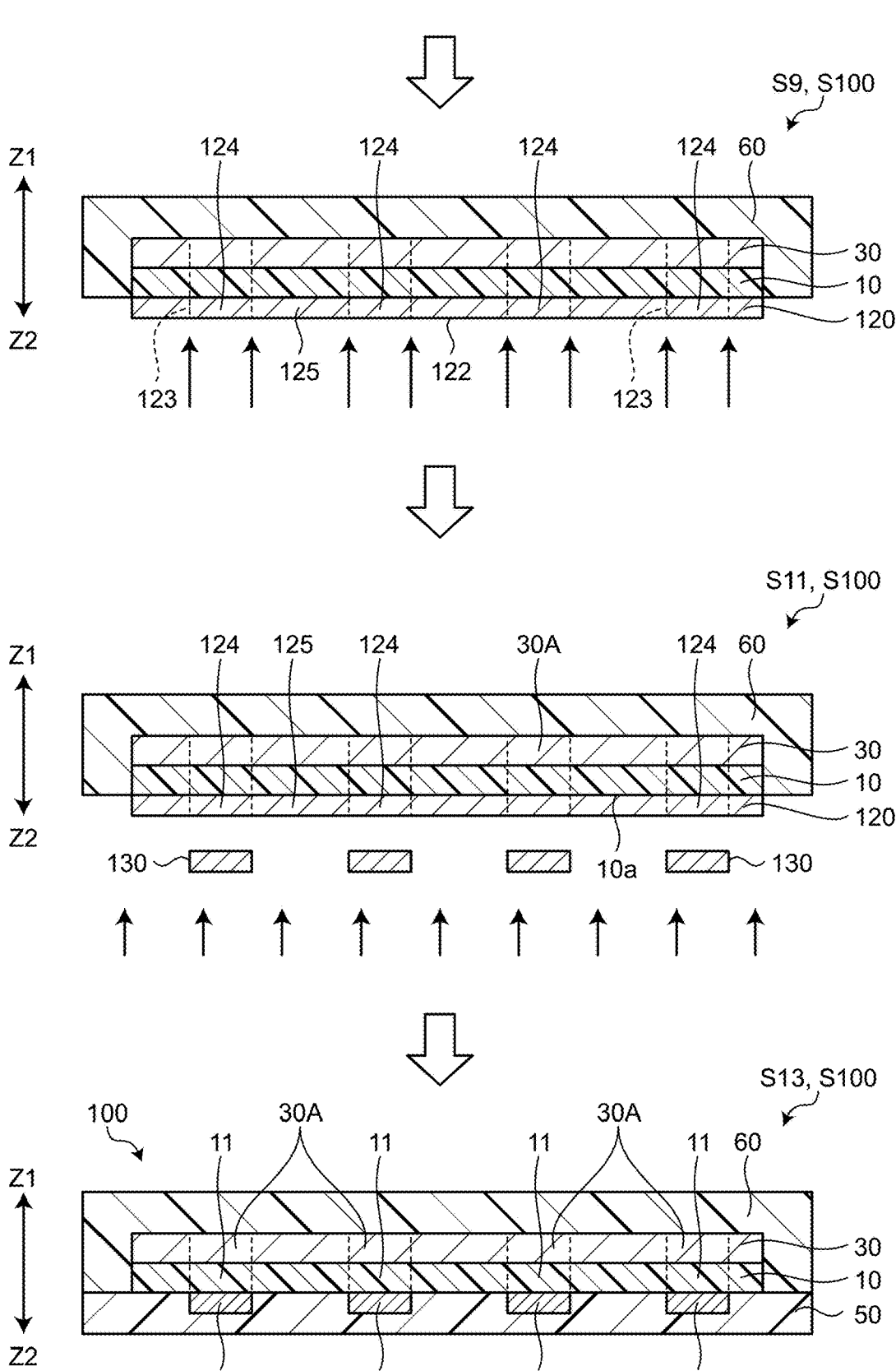
FIG. 9 is a flowchart of the second half of the process of manufacturing the stretchable device according to the first embodiment.

FIG. 8 is a flowchart of the first half of the process of manufacturing the stretchable device according to the first embodiment. FIG. 9 is a flowchart of the second half of the process of manufacturing the stretchable device according to the first embodiment. In the following description, the part of the array layer 30 overlapping the body 11 is referred to as a body array layer 30A, and the part overlapping the hinge 12 is referred to as a hinge array layer 30B.

As illustrated in FIGS. 8 and 9, a manufacturing method S100 of the stretchable device 100 includes a preparation step S1, a resin base member formation step S3, an array layer formation step S5, a second resin layer formation step S7, a trimming step S9, a lift-off step S11, and a first resin layer formation step S13.

As illustrated in FIG. 8, the preparation step S1 is the step of preparing a glass plate 120. The glass plate 120 has a first surface 121 facing the first thickness direction Z1 and a second surface 122 facing the second thickness direction Z2.

At the resin base member formation step S3, a resin layer serving as a solid film is formed on the first surface 121 of the glass plate 120. Subsequently, unnecessary parts are removed by etching to form the resin base member 10.

The array layer formation step S5 is the step of forming the array layer 30 on the surface of the resin base member 10 in the first thickness direction Z1. As a result, the body array layer 30A is provided to the surface of the body 11 in the first thickness direction Z1. The hinge array layer 30B is provided to the surface of the hinge 12 in the first thickness direction Z1. The body array layer 30A includes the transistor 36 (refer to FIG. 6).

The second resin layer formation step S7 is the step of stacking the pre-formed second resin layer 60 on the array layer 30 and the resin base member 10. The second resin layer 60 is highly adhesive. Therefore, the second resin layer 60 adheres to the array layer 30 and the resin base member 10. The outer periphery of the array layer 30 and the resin base member 10 is surrounded by the frame part 62 of the second resin layer 60.

The trimming step S9 is the step of irradiating the second surface 122 of the glass plate 120 with laser light to form cracks 123 in the glass plate 120. The crack 123 is formed to overlap the outer shape of the body 11 and has an annular shape. The part inside the crack 123 is hereinafter referred to as an intermediate glass piece 124, and the other part of the glass plate 120 is referred to as a remaining part 125.

The lift-off step S11 is the step of removing the remaining part 125 of the glass plate 120 from the resin base member 10. Specifically, at the lift-off step S11, a mask 130 is placed on the surface of the intermediate glass piece 124 in the second thickness direction Z2. Next, laser light is applied from the second thickness direction Z2 of the mask 130 toward the surface 10a of the resin base member 10 in the second thickness direction Z2. As a result, a gap is created between the resin base member 10 and the remaining part 125, thereby allowing the remaining part 125 to be removed. By contrast, the adhesive surface between the intermediate glass piece 124 and the resin base member 10 is covered by the mask 130, and the laser light is not incident on it. The adhesion between the intermediate glass piece 124 and the resin base member 10 is maintained. As a result, the intermediate glass piece 124 serves as the glass piece 21. The mask 130 also prevents the laser light from being incident on the body array layer 30A. Therefore, the performance of the transistor 36 is not degraded.

The first resin layer formation step S13 is the step of stacking the pre-formed first resin layer 50 on the resin base member 10 from the second thickness direction Z2. The first resin layer 50 adheres to the resin base member 10. The first resin layer 50 is bonded to the second resin layer 60 by an adhesive. Thus, the stretchable device 100 including the glass pieces 21 is completed.

While the first embodiment has been described, the present disclosure is not limited to the example described above. While the electrical circuit included in the array layer 30 according to the first embodiment is the load detection circuit 31, for example, the electrical circuit according to the present disclosure is not particularly limited and may be a force detection circuit that detects a load applied to the surface 1 or a detection circuit that detects light incident on the surface 1.

While the first rigid part 20 (glass piece 21) according to the first embodiment has a rectangular (square) shape in plan view, the shape according to the present disclosure is not limited thereto. Next, first and second modifications are described where the shape of the first rigid part 20 is modified. The following mainly describes the differences from the first embodiment.

First Modification

Figure 10:
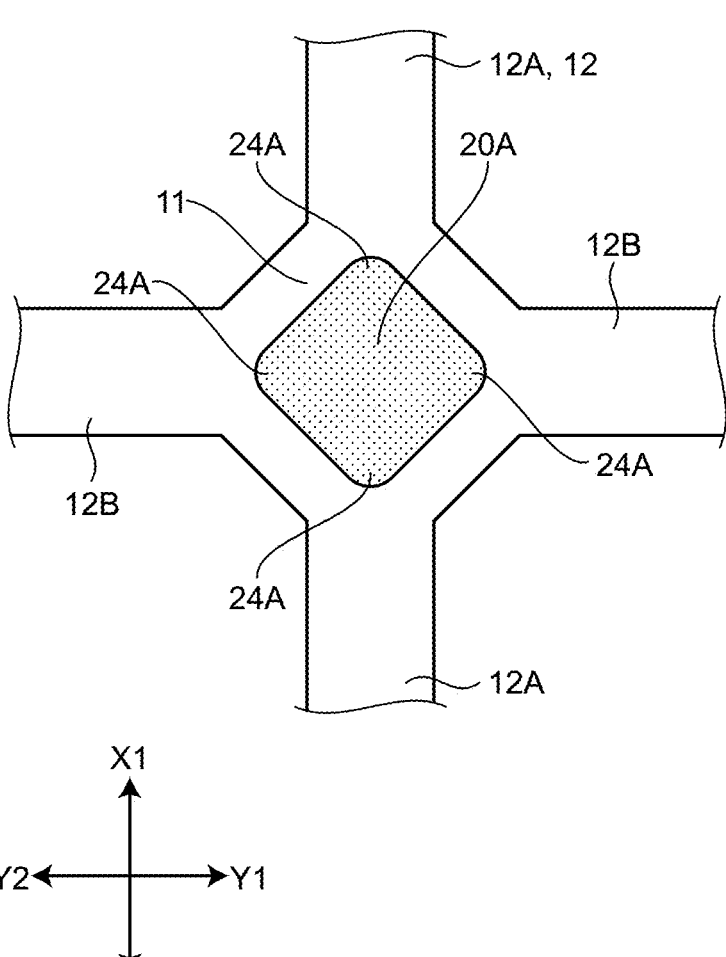
FIG. 10 is an enlarged view of a first rigid part according to a first modification viewed from the second thickness direction.

FIG. 10 is an enlarged view of the first rigid part according to the first modification viewed from the second thickness direction. As illustrated in FIG. 10, a first rigid part 20A according to the first modification is the same as the first rigid part 20 according to the first embodiment in that it has a rectangular shape in plan view. The first rigid part 20A according to the first modification, however, is different from the first rigid part 20 according to the first embodiment in that corners 24A of the first rigid part 20A are rounded. In other words, the corners 24A are formed in an arc shape in plan view.

When a compressive load or a bending load acts on the stretchable device 100, the first resin layer 50 is pressed against the corner 24A of the first rigid part 20A. The corner 24 according to the first embodiment is pointed, whereby the first resin layer 50 may possibly tear. By contrast, the corner 24A according to the first modification is not pointed, whereby the probability of the first resin layer 50 tearing is significantly low. Therefore, the durability of the first resin layer 50 is improved.

Second Modification

Figure 11:
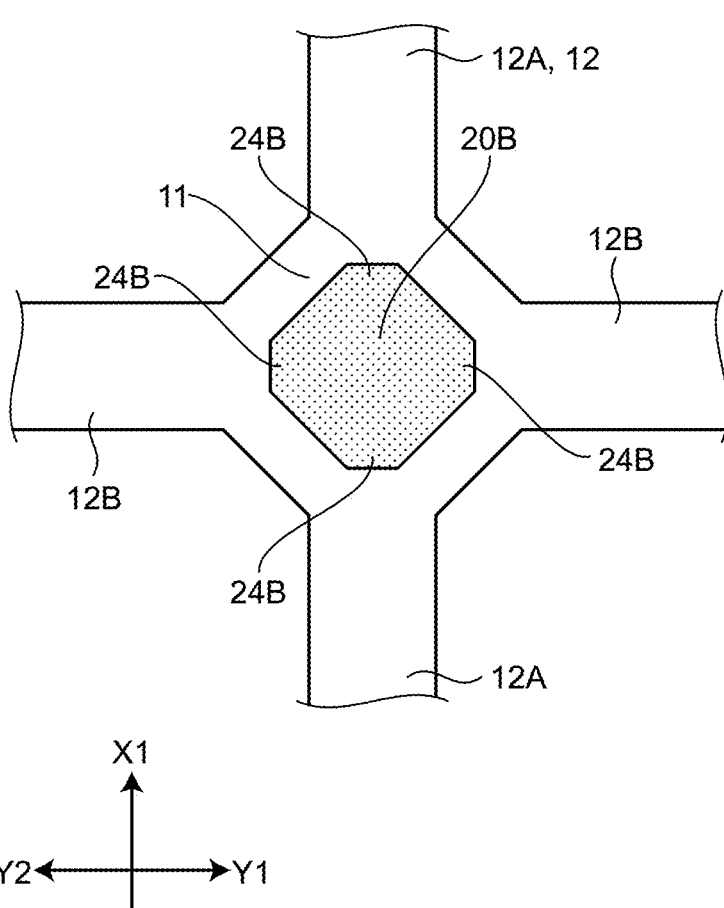
FIG. 11 is an enlarged view of the first rigid part according to a second modification viewed from the second thickness direction.

FIG. 11 is an enlarged view of the first rigid part according to the second modification viewed from the second thickness direction. As illustrated in FIG. 11, a first rigid part 20B according to the second modification is the same as the first rigid part 20 according to the first embodiment in that it has a rectangular shape in plan view. The first rigid part 20B according to the second modification, however, is different from the first rigid part 20 according to the first embodiment in that corners 24B are chamfered. In other words, the corners 24B are formed in a linear shape in plan view. With the corner 24B, the probability of the first resin layer 50 tearing is significantly low, and the durability of the first resin layer 50 is improved similarly to the first modification.

While the stretchable device 100 according to the first embodiment includes the first rigid parts 20, for example, the present disclosure may further include second rigid parts besides the glass pieces 21 (first rigid parts 20). The following describes a stretchable device 100C according to a second embodiment including the first rigid parts 20 and the second rigid parts.

Second Embodiment

Figure 12:
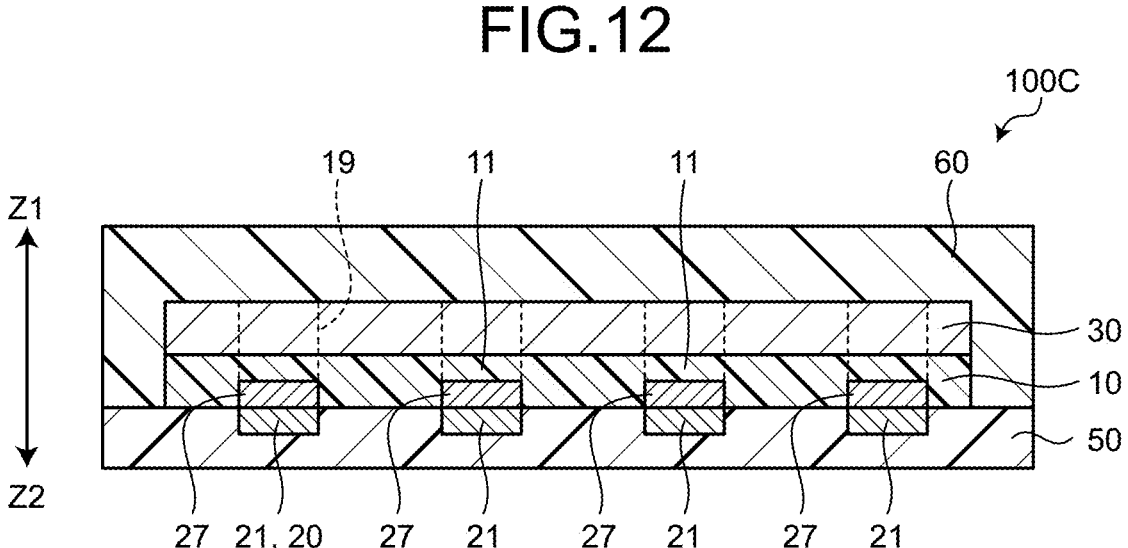
FIG. 12 is a schematic of a section of the stretchable device according to a second embodiment.
Figure 13:
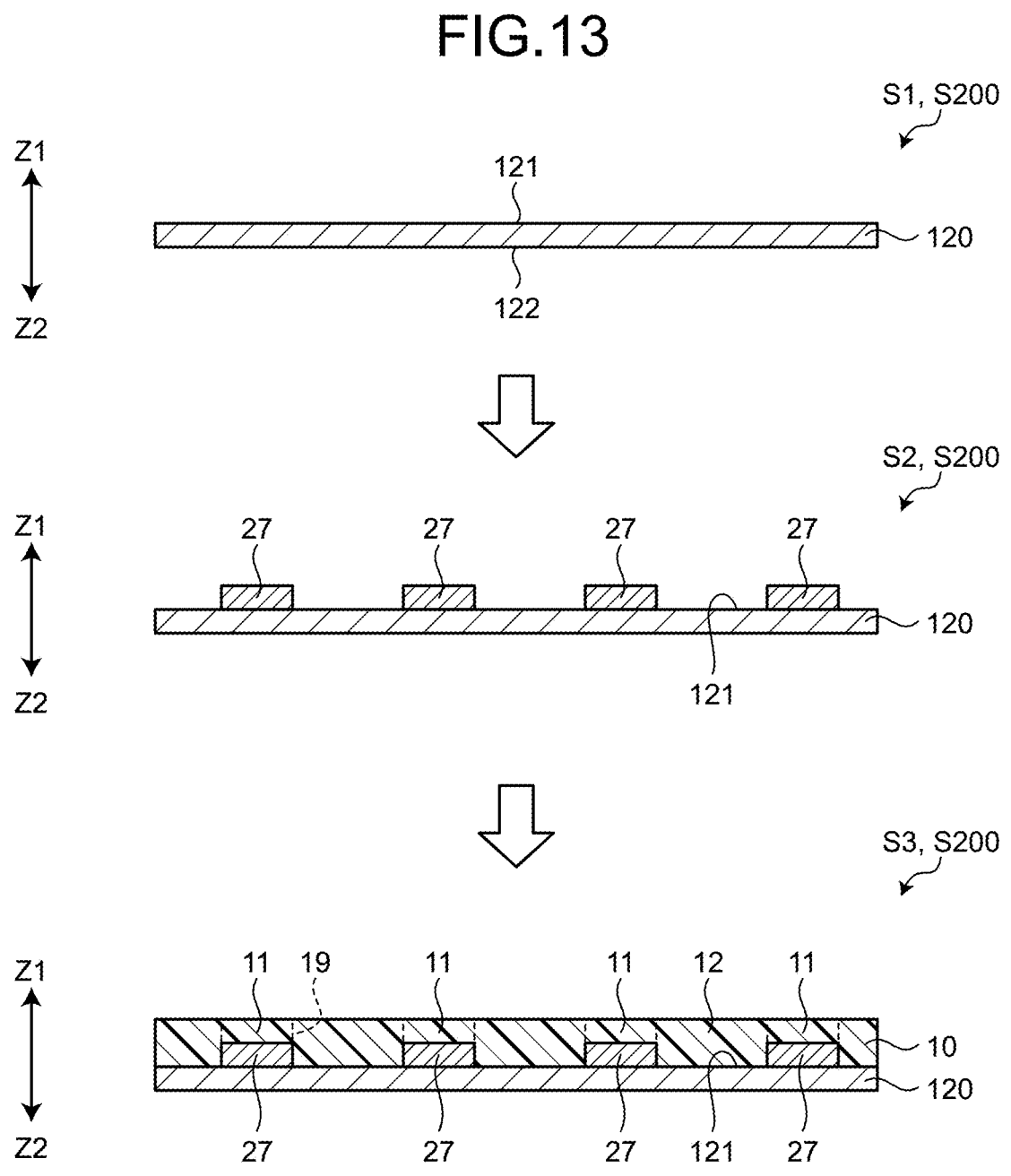
Figure 14:
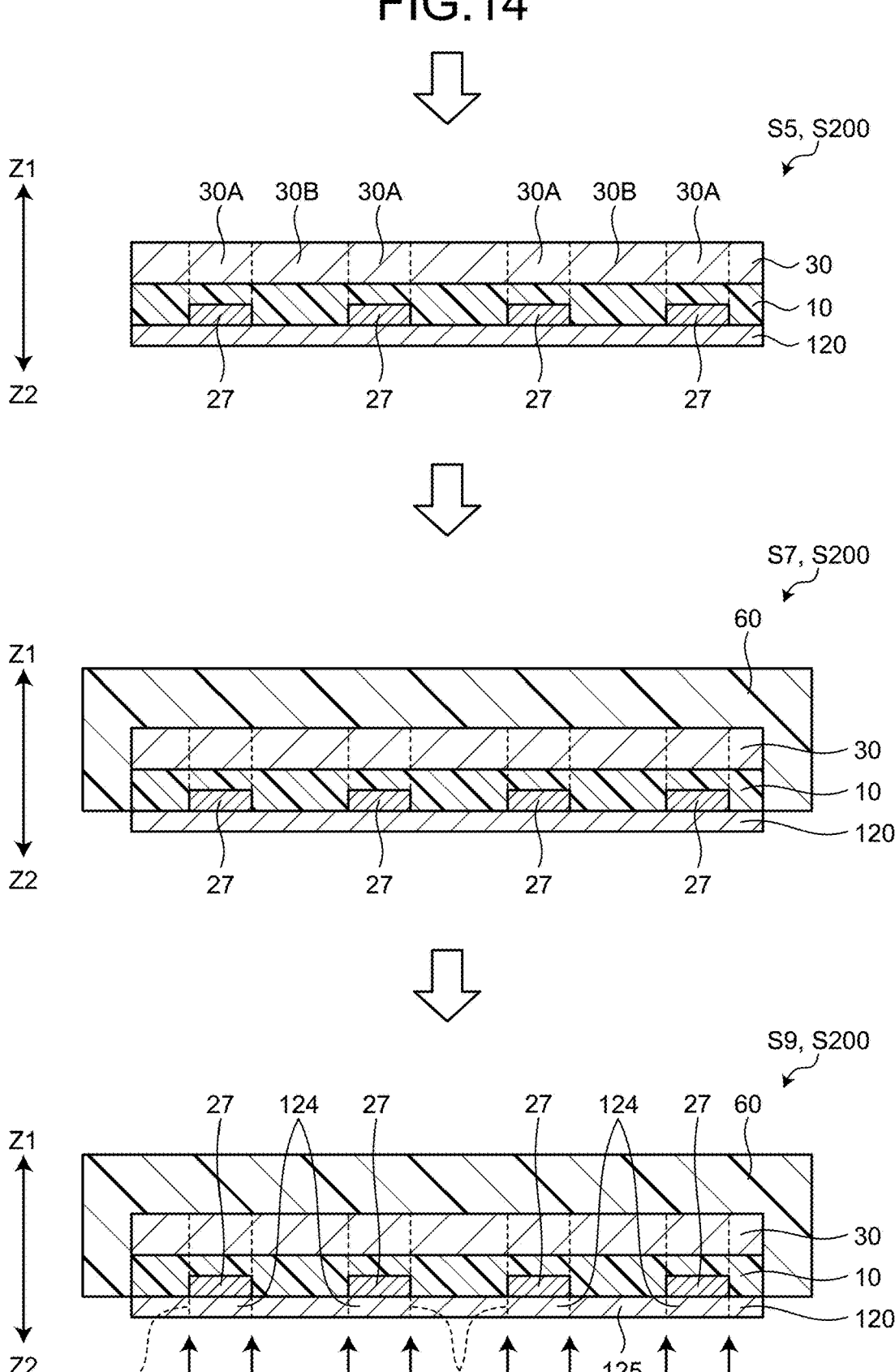
FIG. 14 is a flowchart of the middle part of the process of manufacturing the stretchable device according to the second embodiment.
Figure 15:
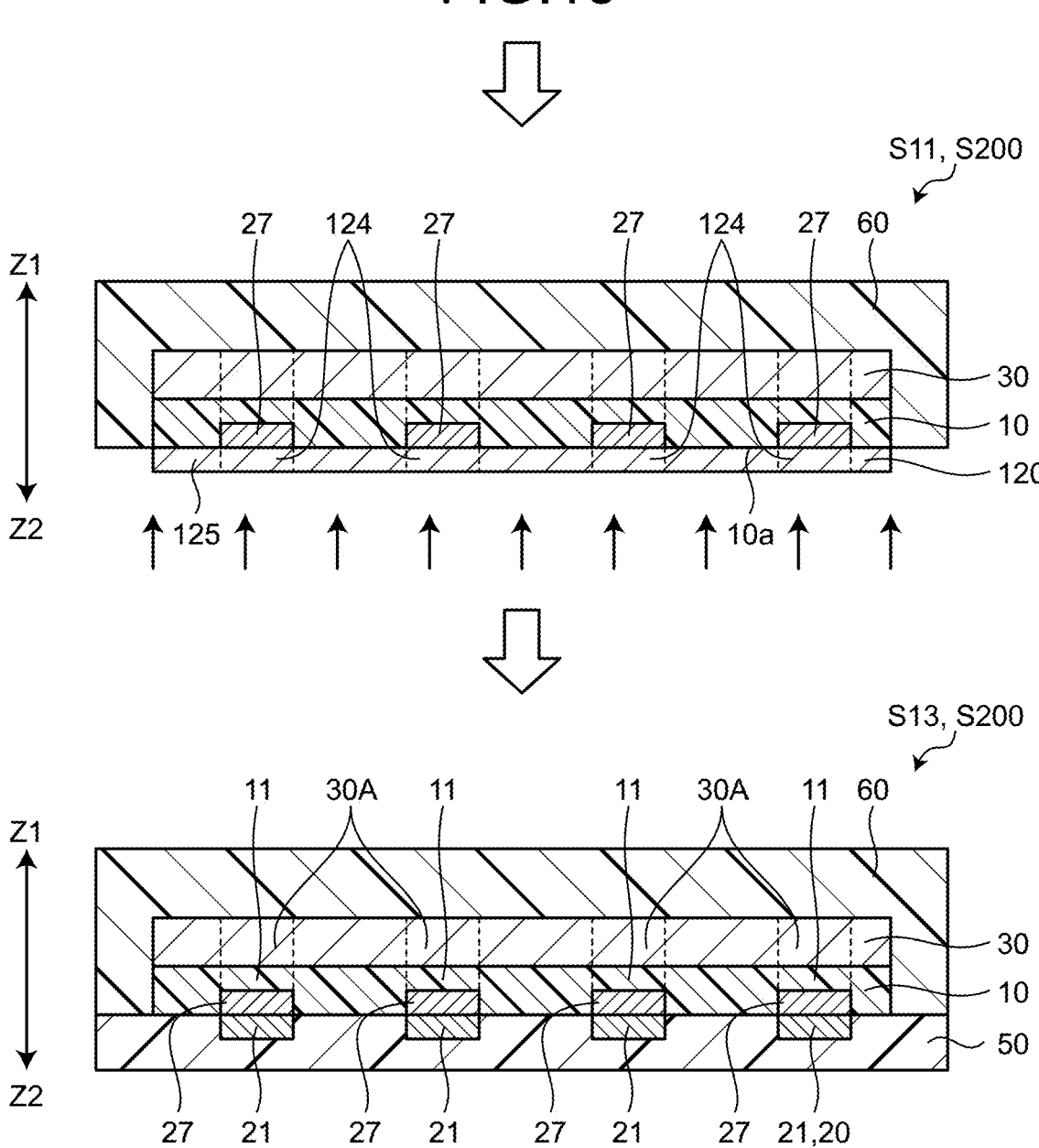
FIG. 15 is a flowchart of the latter part of the process of manufacturing the stretchable device according to the second embodiment.

FIG. 12 is a schematic of a section of the stretchable device according to the second embodiment. FIG. 13 is a flowchart of the former part of the process of manufacturing the stretchable device according to the second embodiment. FIG. 14 is a flowchart of the middle part of the process of manufacturing the stretchable device according to the second embodiment. FIG. 15 is a flowchart of the latter part of the process of manufacturing the stretchable device according to the second embodiment. The stretchable device 100C according to the second embodiment is the same as the first embodiment in that the first resin layer 50 is provided with the glass pieces 21 (first rigid parts 20). The stretchable device 100C according to the second embodiment, however, is different from the first embodiment in that it is further provided with second rigid parts 27.

The second rigid part 27 is a metal piece made of metal material. The type of the metal material is not particularly limited as long as it has higher elastic modulus than those of the resin layers (the first resin layer 50 and the second resin layer 60). The second rigid part 27 overlaps the body 11 and the first rigid part 20 in plan view. The second rigid parts 27 are provided to the resin base member 10. The second embodiment suppresses deformation of the bodies 11. Therefore, damage to the functional elements (transistors 36) is reliably prevented.

As illustrated in FIGS. 13 to 15, a manufacturing method S200 of the stretchable device 100C includes the preparation step S1, a second rigid part formation step S2, the resin base member formation step S3, the array layer formation step S5, the second resin layer formation step S7, the trimming step S9, the lift-off step S11, and the first resin layer formation step S13. The manufacturing method S200 according to the second embodiment is different from the manufacturing method S100 according to the first embodiment in that it includes the second rigid part formation step S2. The steps described in the first embodiment are briefly explained.

As illustrated in FIG. 13, the preparation step S1 is the step of preparing the glass plate 120. The second rigid part formation step S2 is the step of forming the second rigid parts 27 on the first surface 121 of the glass plate 120. The method for forming the second rigid parts 27 is not particularly limited. For example, the second rigid parts 27 may be formed by forming a metal layer serving as a solid film on the first surface 121 of the glass plate 120 and then removing unnecessary parts by etching.

The resin base member formation step S3 is the step of forming the resin base member 10 on the surface of the glass plate 120 in the first thickness direction Z1. In the configuration according to the present embodiment, the second rigid parts 27 are provided on the first surface 121 of the glass plate 120. For this reason, the resin base member 10 is formed by forming a resin layer serving as a solid film to cover the second rigid parts 27 and then performing etching.

As illustrated in FIG. 14, the array layer formation step S5 is the step for forming the array layer 30 on the surface of the resin base member 10 in the first thickness direction Z1. The second resin layer formation step S7 is the step of stacking the pre-formed second resin layer 60 on the array layer 30 and the resin base member 10. The trimming step S9 is the step of irradiating the second surface 122 of the glass plate 120 with laser light to form the cracks 123.

As illustrated in FIG. 15, the lift-off step S11 is the step of removing the remaining part 125 of the glass plate 120 from the resin base member 10. In the present embodiment, the mask 130 is not placed on the surface of the intermediate glass piece 124 in the second thickness direction 22 because the second rigid part 27 is provided. When the laser light is applied toward the surface 10a of the resin base member 10 in the second thickness direction Z2, a gap is created between the resin base member 10 and the remaining part 125, and the remaining part 125 is removed from the resin base member 10. The amount of energy of the laser light applied at the lift-off step S11 is not large enough to create a gap on the bonded surface between the intermediate glass piece 124 and the second rigid part 27, and the bonded state is maintained. Therefore, the intermediate glass piece 124 is not removed and remains as the glass piece 21. The second rigid part 27 prevents the laser light from being incident on the transistor 36. Therefore, the performance of the transistor 36 is not degraded.

The first resin layer formation step S13 is the step of stacking the pre-formed first resin layer 50 on the resin base member 10 from the second thickness direction Z2. Thus, the stretchable device 100C including the glass pieces 21 and the second rigid parts 27 is completed.

While the first and the second embodiments have described an example where the glass piece 21 is used as the first rigid part 20, the first rigid part 20 according to the present disclosure may be made of material other than glass. The following third embodiment describes a stretchable device 100D including the first rigid parts 20 made of material other than glass.

Third Embodiment

Figure 16:
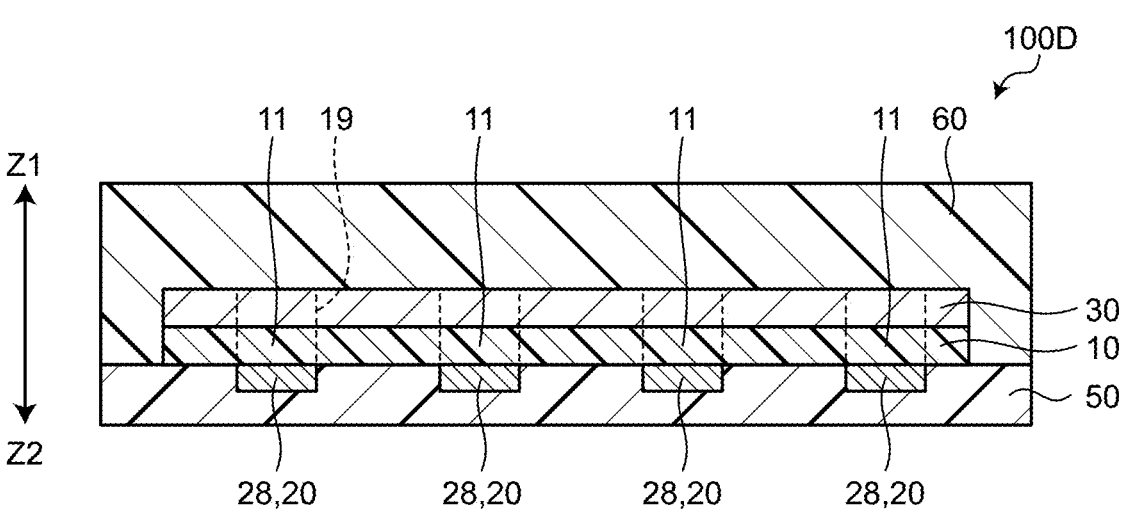
FIG. 16 is a schematic of a section of the stretchable device according to a third embodiment.
Figure 17:
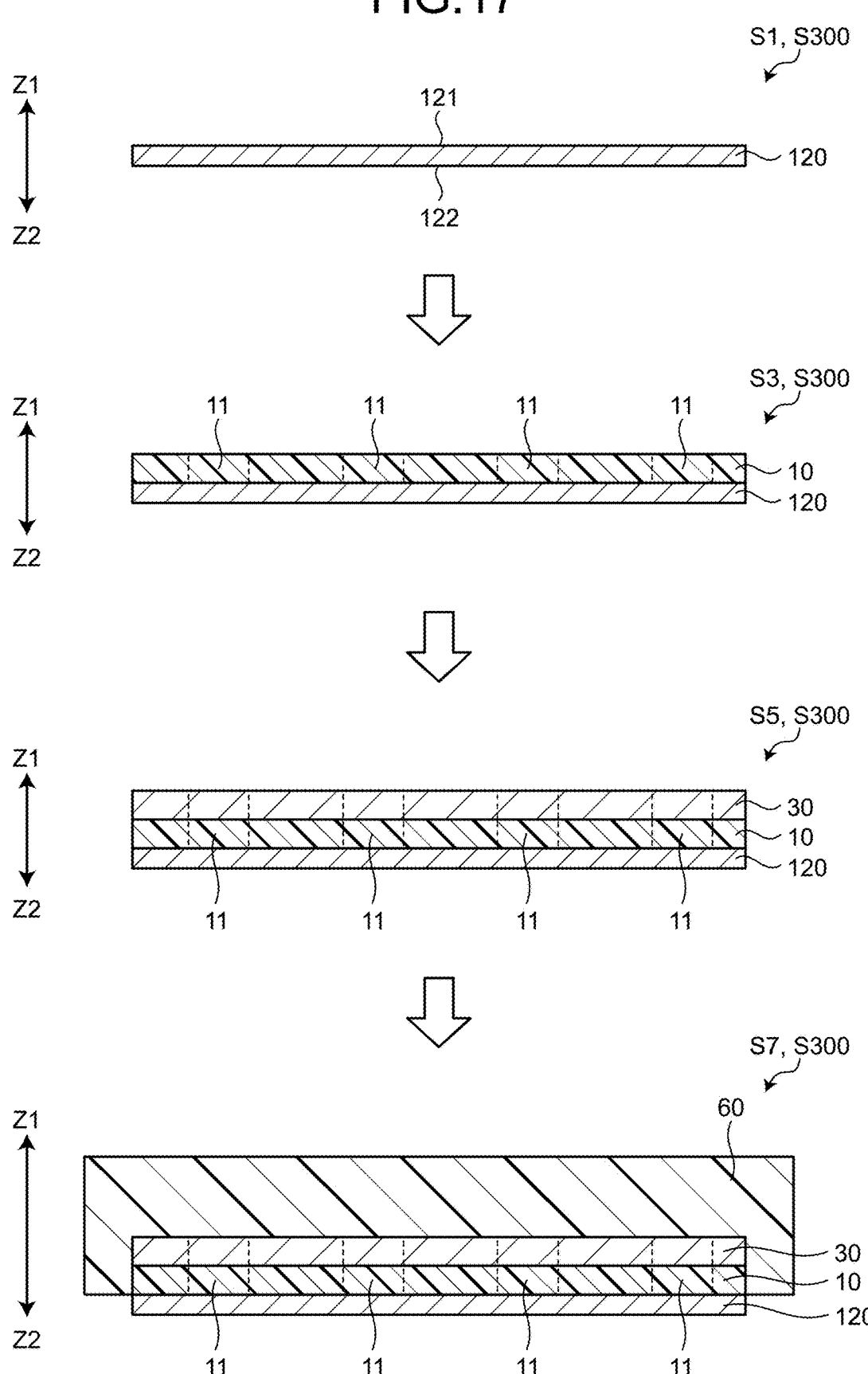
FIG. 17 is a flowchart of the first half of the process of manufacturing the stretchable device according to the third embodiment.
Figure 18:
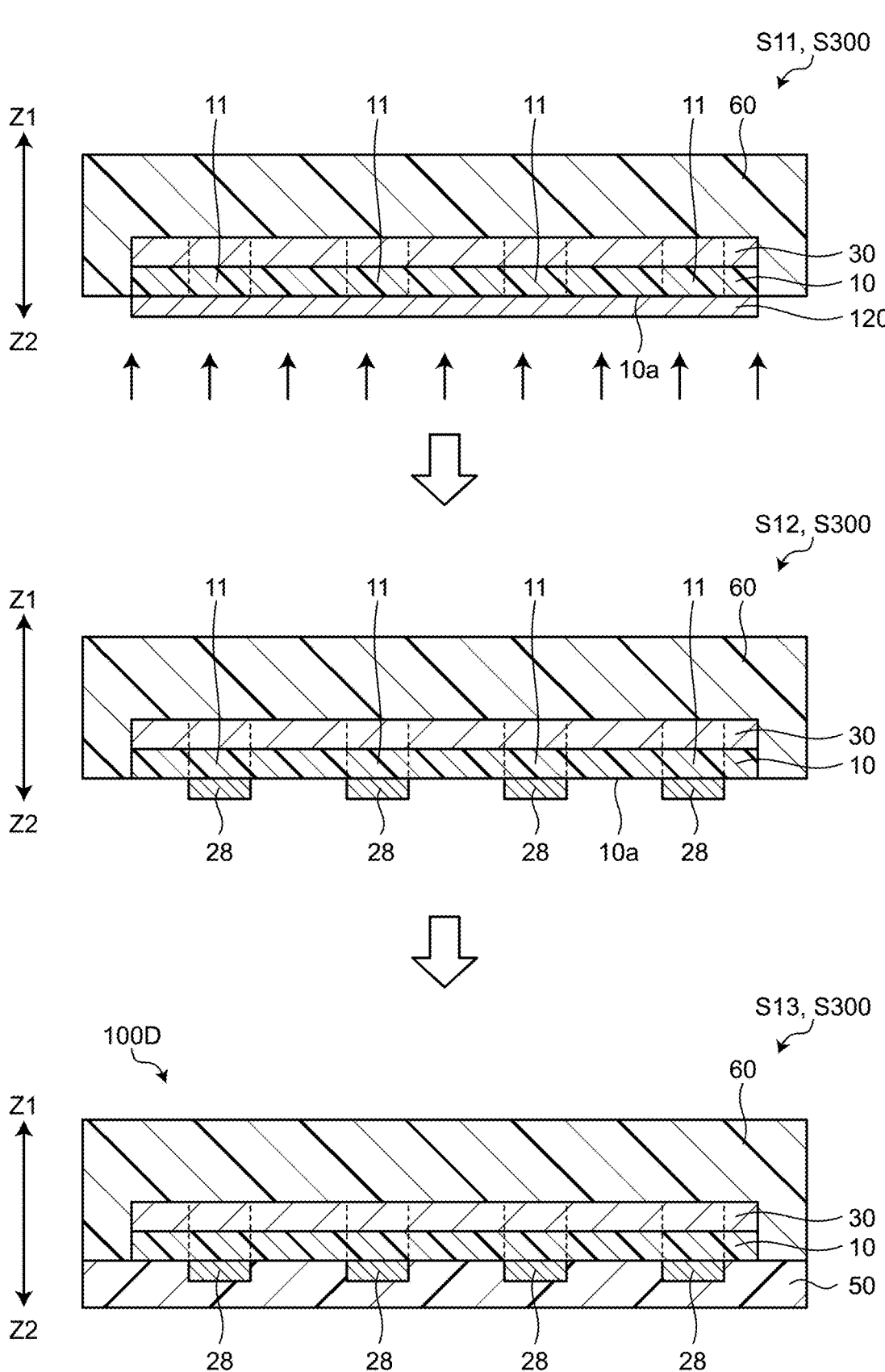
FIG. 18 is a flowchart of the second half of the process of manufacturing the stretchable device according to the third embodiment.

FIG. 16 is a schematic of a section of the stretchable device according to the third embodiment. FIG. 17 is a flowchart of the first half of the process of manufacturing the stretchable device according to the third embodiment. FIG. 18 is a flowchart of the second half of the process of manufacturing the stretchable device according to the third embodiment.

The stretchable device 100D according to the third embodiment is different from the first embodiment in that it includes resin pieces 28 instead of the glass pieces 21. The resin pieces 28 are provided to the first resin layer 50. The resin piece 28 is made of resin material with higher elastic modulus than those of the resin layers (the first resin layer 50 and the second resin layer 60). The first rigid part 20 (resin piece 28) according the third embodiment also reduces deformation of the body 11 and prevents damage to the functional element (transistor 36).

As illustrated in FIGS. 17 and 18, a manufacturing method S300 of the stretchable device 100D includes the preparation step S1, the resin base member formation step S3, the array layer formation step S5, the second resin layer formation step S7, the lift-off step S11, a resin piece formation step S12, and the first resin layer formation step S13. The manufacturing method S300 according to the third embodiment is different from the manufacturing method S100 according to the first embodiment in that it does not include the trimming step S9. The manufacturing method S300 according to the third embodiment is different from the manufacturing method S100 according to the first embodiment in that it includes the resin piece formation step S12.

As illustrated in FIG. 17, the glass plate 120 is prepared at the preparation step S1. At the resin base member formation step S3, the resin base member 10 is formed on the surface of the glass plate 120 in the first thickness direction Z1. At the array layer formation step S5, the array layer 30 is formed on the surface of the resin base member 10 in the first thickness direction Z1. At the second resin layer formation step S7, the second resin layer 60 is stacked on and adheres to the array layer 30 and the resin base member 10.

As illustrated in FIG. 18, at the lift-off step S11, laser light is applied from the second thickness direction Z2 of the glass plate 120 toward the surface 10a of the resin base member 10. The present embodiment does not use the mask 130. As a result, the entire glass plate 120 is removed from the resin base member 10.

At the resin piece formation step S12, a resin layer serving as a solid film is formed on the surface 10a of the resin base member 10, and then etching is performed to form the resin pieces 28. The first resin layer formation step S13 is the step of arranging the pre-formed first resin layer 50 on the surface of the resin base member 10 in the second thickness direction Z2. Thus, the stretchable device 100D including the resin pieces 28 is completed.

While the resin pieces 28 according to the third embodiment are provided to the first resin layer 50, the present disclosure is not limited thereto. The following describes a fourth embodiment where the position of the resin pieces 28 is changed.

Fourth Embodiment

Figure 19:
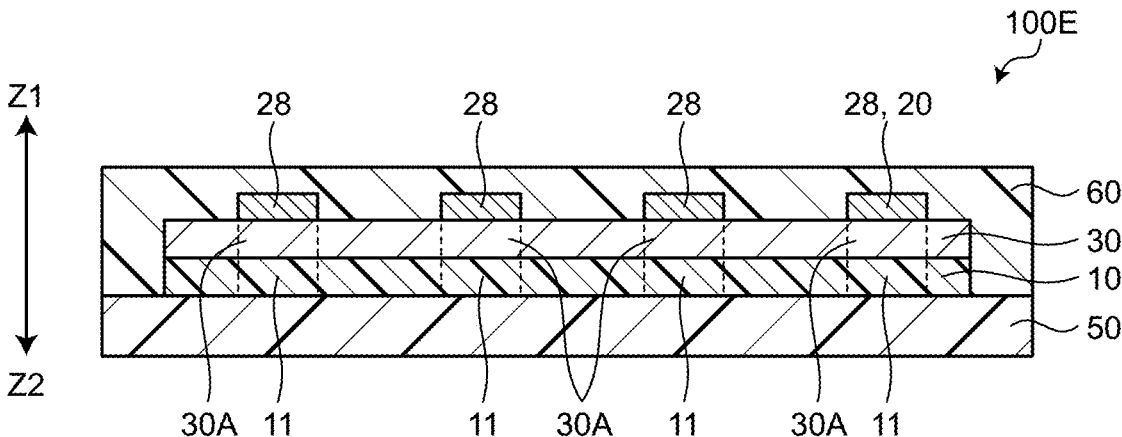
FIG. 19 is a schematic of a section of the stretchable device according to a fourth embodiment.
Figure 20:
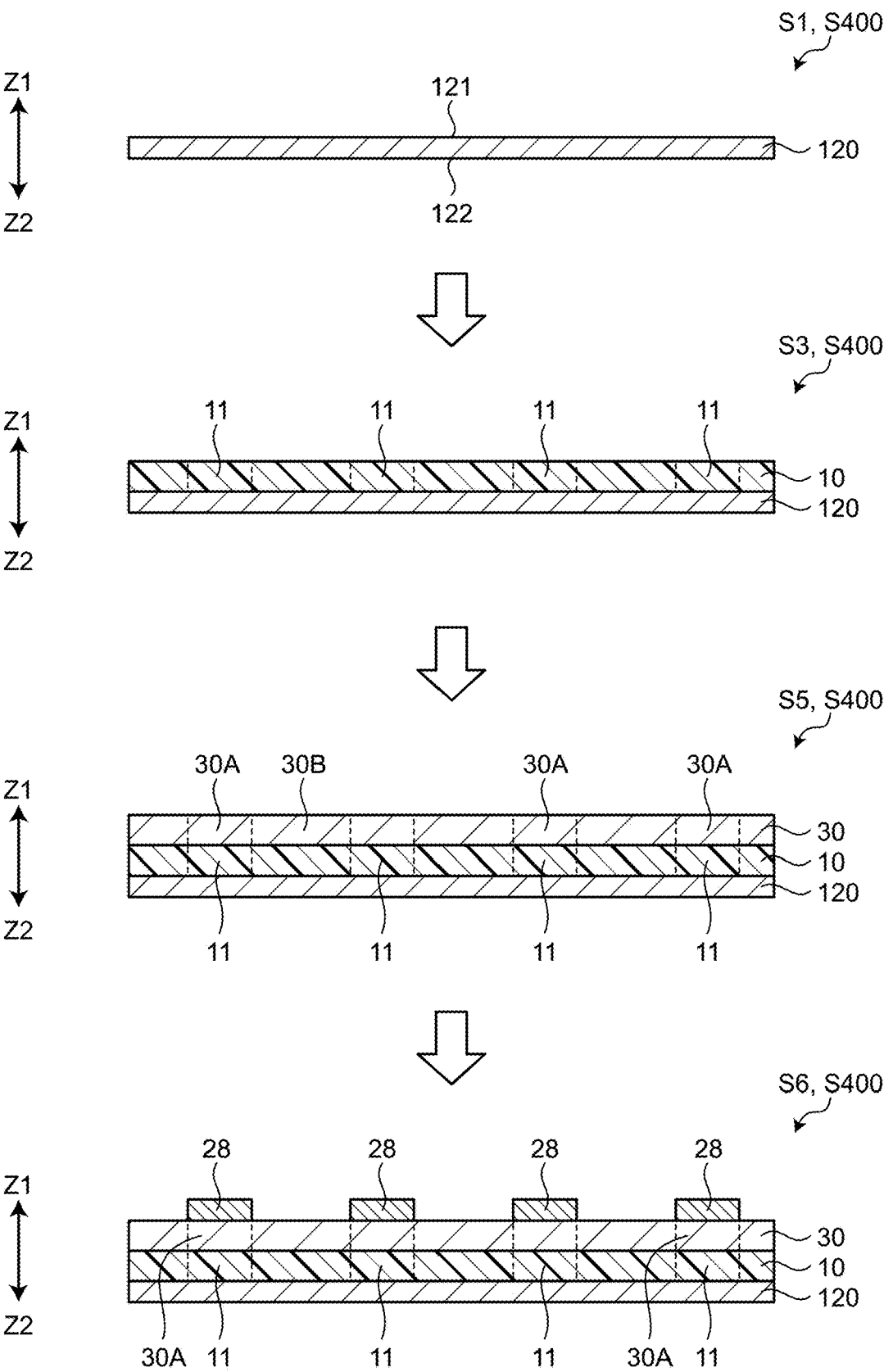
FIG. 20 is a flowchart of the first half of the process of manufacturing the stretchable device according to the fourth embodiment.
Figure 21:
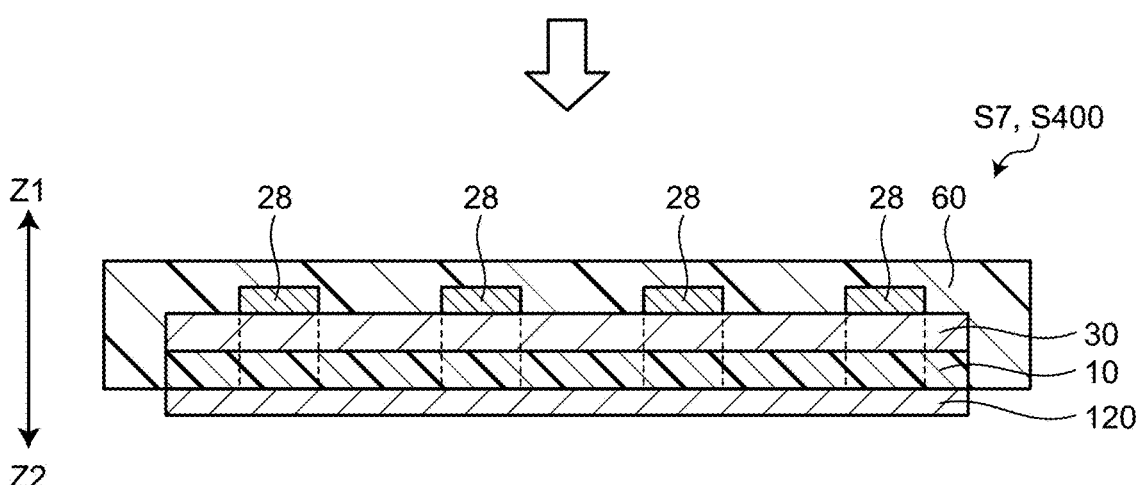
FIG. 21 is a flowchart of the second half of the process of manufacturing the stretchable device according to the fourth embodiment.

FIG. 19 is a schematic of a section of the stretchable device according to the fourth embodiment. FIG. 20 is a flowchart of the first half of the process of manufacturing the stretchable device according to the fourth embodiment. FIG. 21 is a flowchart of the second half of the process of manufacturing the stretchable device according to the fourth embodiment.

A stretchable device 100E according to the fourth embodiment is different from the third embodiment in that the resin pieces 28 are provided to the second resin layer 60. The resin piece 28 is disposed on the surface of the body array layer 30A of the array layer 30 in the first thickness direction Z1. The stretchable device 100E reduces deformation of the bodies 11 and prevents damage to the functional elements (transistors 36) provided to the body array layers 30A.

As illustrated in FIGS. 20 and 21, a manufacturing method S400 of the stretchable device 100E includes the preparation step S1, the resin base member formation step S3, the array layer formation step S5, a resin piece formation step S6, the second resin layer formation step S7, the lift-off step S11, and the first resin layer formation step S13. The manufacturing method S400 according to the fourth embodiment is different from the manufacturing method S300 according to the third embodiment in that it does not include the resin piece formation step S12. The manufacturing method S400 according to the fourth embodiment is different from the manufacturing method S300 according to the third embodiment in that it includes the resin piece formation step S6.

As illustrated in FIG. 20, the glass plate 120 is prepared at the preparation step S1. At the resin base member formation step S3, the resin base member 10 is formed on the surface of the glass plate 120 in the first thickness direction Z1. At the array layer formation step S5, the array layer 30 is formed on the surface of the resin base member 10 in the first thickness direction Z1.

At the resin piece formation step S6, a resin layer serving as a solid film is formed on the surface of the array layer 30 in the first thickness direction Z1, and then etching is performed to form the resin pieces 28. At the second resin layer formation step S7, the second resin layer 60 is stacked on the resin pieces 28 from the first thickness direction Z1 and adheres to each of the resin pieces 28, the array layer 30, and the resin base member 10.

As illustrated in FIG. 21, at the lift-off step S11, laser light is applied from the second thickness direction of the glass plate 120 toward the surface 10a of the resin base member 10 in the second thickness direction. The present embodiment does not use the mask 130. As a result, the entire glass plate 120 is removed from the resin base member 10. At the first resin layer formation step S13, the pre-formed first resin layer 50 is arranged on the surface of the resin base member 10 in the second thickness direction 22, and the first resin layer 50 is bonded to the second resin layer 60. Thus, the stretchable device 100E including the resin pieces 28 is completed.

While the resin piece 28 according to the fourth embodiment is separated from the resin base member 10, the resin base member 10 and the resin piece 28 may be integrated. In other words, the resin base member 10 with different thicknesses in the thickness direction may be formed, and the thicker part may be used as the first rigid part 20.

What is claimed is:

1. A stretchable device comprising:

a resin base member;

an array layer provided to the resin base member; and a pair of resin layers that sandwich the resin base member and the array layer from both sides in a thickness direction in which the resin base member and the array layer are disposed, the resin layers being made of resin having lower elastic modulus than that of the resin base member, wherein the resin base member includes:

a plurality of bodies separated from each other in a direction orthogonal to the thickness direction; and a plurality of hinges that couple the bodies while meandering, the array layer includes functional elements overlapping the bodies when viewed in the thickness direction, the resin layers are provided with first rigid parts having higher elastic modulus than that of the resin that forms the resin layers, and the first rigid parts overlap the bodies when viewed in the thickness direction.

2. The stretchable device according to claim 1, wherein the pair of resin layers includes:

a first resin layer disposed opposite to the array layer with respect to the resin base member; and a second resin layer disposed opposite to the resin base member with respect to the array layer, and each of the first rigid parts is a glass piece provided to the first resin layer.

3. The stretchable device according to claim 2, wherein the glass piece has an outer periphery surface formed in a rectangular shape when viewed in the thickness direction, and a corner of the outer peripheral surface is chamfered.

4. The stretchable device according to claim 3, wherein the resin base member is provided with second rigid parts made of metal material and overlapping the bodies and the first rigid parts when viewed in the thickness direction.

5. The stretchable device according to claim 2, wherein the resin base member is provided with second rigid parts made of metal material and overlapping the bodies and the first rigid parts when viewed in the thickness direction.

6. The stretchable device according to claim 1, wherein each of the first rigid parts is made of resin having higher elastic modulus than those of the resin layers and the resin base member.

7. The stretchable device according to claim 1, wherein each of the first rigid parts is disposed on an inner side than the outer shape of a corresponding one of the bodies when viewed in the thickness direction.

8. The stretchable device according to claim 7, wherein each of the first rigid parts overlaps the entire functional element when viewed in the thickness direction.

9. The stretchable device according to claim 1, wherein each of the first rigid parts overlaps the entire functional element when viewed in the thickness direction.

* * * * *